United States Patent [19]
Jiang

[11] Patent Number: 5,602,502
[45] Date of Patent: Feb. 11, 1997

[54] CIRCUIT FOR DETECTING WHEN A SUPPLY OUTPUT VOLTAGE EXCEEDS A PREDETERMINED LEVEL

[75] Inventor: Yong H. Jiang, Milpitas, Calif.

[73] Assignee: Intel Corporation, Santa Clara, Calif.

[21] Appl. No.: 536,853

[22] Filed: Sep. 29, 1995

[51] Int. Cl.$^6$ ..................................... H03L 7/00
[52] U.S. Cl. .......................................... 327/143
[58] Field of Search .................. 327/142, 143, 327/198

[56] References Cited

U.S. PATENT DOCUMENTS

| | | | |
|---|---|---|---|
| 5,187,389 | 2/1993 | Hall et al. | 327/143 |
| 5,302,861 | 5/1994 | Jelinek | 327/143 |
| 5,463,335 | 10/1995 | Divakaruni et al. | 327/143 |

Primary Examiner—Timothy P. Callahan
Assistant Examiner—Jeffrey Zweizig
Attorney, Agent, or Firm—Blakely, Sokoloff, Taylor & Zafman

[57] ABSTRACT

A power-on detection circuit for detecting when a supply output voltage exceeds a predetermined level. According to a present embodiment, the power-on detection circuit generally comprises a pull-up transistor, a pull-down transistor, and an inverter. The pull-up transistor and the pull-down transistor are commonly coupled to a node for biasing the node to a first voltage, and the inverter has its input coupled to receive the first voltage. The inverter indicates that the supply output voltage is less than the predetermined level when the first voltage is greater than a trip voltage of the inverter. The inverter indicates that the supply output voltage exceeds the predetermined level when the first voltage is less than the trip voltage of the inverter. According to one embodiment, a biasing circuit comprising a voltage divider is provided to bias the pull-down transistor as a function of the supply output voltage such that the gate voltage of the pull-down transistor varies at the same rate as the supply output voltage.

6 Claims, 2 Drawing Sheets

CIRCUIT FOR DETECTING WHEN A SUPPLY OUTPUT VOLTAGE EXCEEDS A PREDETERMINED LEVEL

FIELD OF THE INVENTION

The present invention relates generally to integrated circuits and more specifically to a circuit for detecting when a supply output voltage exceeds a predetermined level such that an integrated circuit may begin normal operation.

BACKGROUND

When a power supply is switched on, the output voltage level of the power supply rises from zero volts to the nominal supply voltage, which may be, for example, 3.3 volts or 5.0 volts. To better ensure proper operation of an integrated circuit that is powered by the power supply, "power-on" detection circuits are used to prevent the integrated circuit from performing logical operations until the supply output voltage has achieved a predetermined level.

Different power supplies require different amounts of time to rise or "ramp" to the nominal supply voltage, and the power-on detection circuit of an integrated circuit should be able to function accurately over a wide range of ramp rates to better ensure proper operation regardless of the power supply used by a particular system. Therefore, it is desirable to provide a power-on detection circuit that operates over a wide range of ramp rates.

SUMMARY OF THE INVENTION

A power-on detection circuit for detecting when a supply output voltage exceeds a predetermined level is described. According to a present embodiment, the power-on detection circuit generally comprises a pull-up transistor, a pull-down transistor, and an inverter. The pull-up transistor and the pull-down transistor are commonly coupled to a node for biasing the node to a first voltage, and the inverter has its input coupled to receive the first voltage. The inverter indicates that the supply output voltage is less than the predetermined level when the first voltage is greater than a trip voltage of the inverter. The inverter indicates that the supply output voltage exceeds the predetermined level when the first voltage is less than the trip voltage of the inverter.

According to one embodiment, a biasing circuit comprising a voltage divider is provided to bias the pull-down transistor as a function of the supply output voltage such that the gate voltage of the pull-down transistor varies at the same rate as the supply output voltage. A charging circuit comprising an RC network is provided to bias the pull-up transistor. The charging circuit is disabled from applying a gate voltage to the pull-up transistor until the supply output voltage exceeds the predetermined level, whereupon the charging circuit applies a gate voltage that is an RC function of the supply output voltage. A hysteresis circuit is coupled to provide positive feedback that stabilizes the digital output of the power-on detection circuit and to provide the enable signal to the charging circuit.

Other features and advantages of the present invention will be apparent from the accompanying drawings and from the detailed description which follows below.

BRIEF DESCRIPTION OF THE DRAWINGS

The features and advantages of the present invention will be more fully described in the following detailed description, wherein.

DETAILED DESCRIPTION

A power-on detection circuit that operates over a wide range of power supply ramp rates is described. The power-on detection circuit generally comprises a trip circuit that includes a pull-up transistor and a pull-down transistor. The pull-up transistor is initially biased to provide a strong pull-up to set the voltage at a common node to the supply output voltage. The pull-down transistor is biased in response to the supply output voltage such that the strength of the pull-down increases as the supply output voltage increases. Thus, the voltage at the common node of the trip circuit decreases as the supply output voltage ramps. Once the voltage of the common node drops to a trip voltage, the power-on detection circuit outputs a digital signal that indicates that power is available, and the pull-up transistor is switched off to reduce power consumption of the power-on detection circuit during normal operation. According to one embodiment, after the supply output voltage reaches a normal operating level, the pull-up transistor is biased using an RC filter network such that voltage transients do not incorrectly change the state of the output of the power-on detection circuit. Furthermore, hysteresis is used to prevent metastability of the power-on detection circuit.

Figure 1:
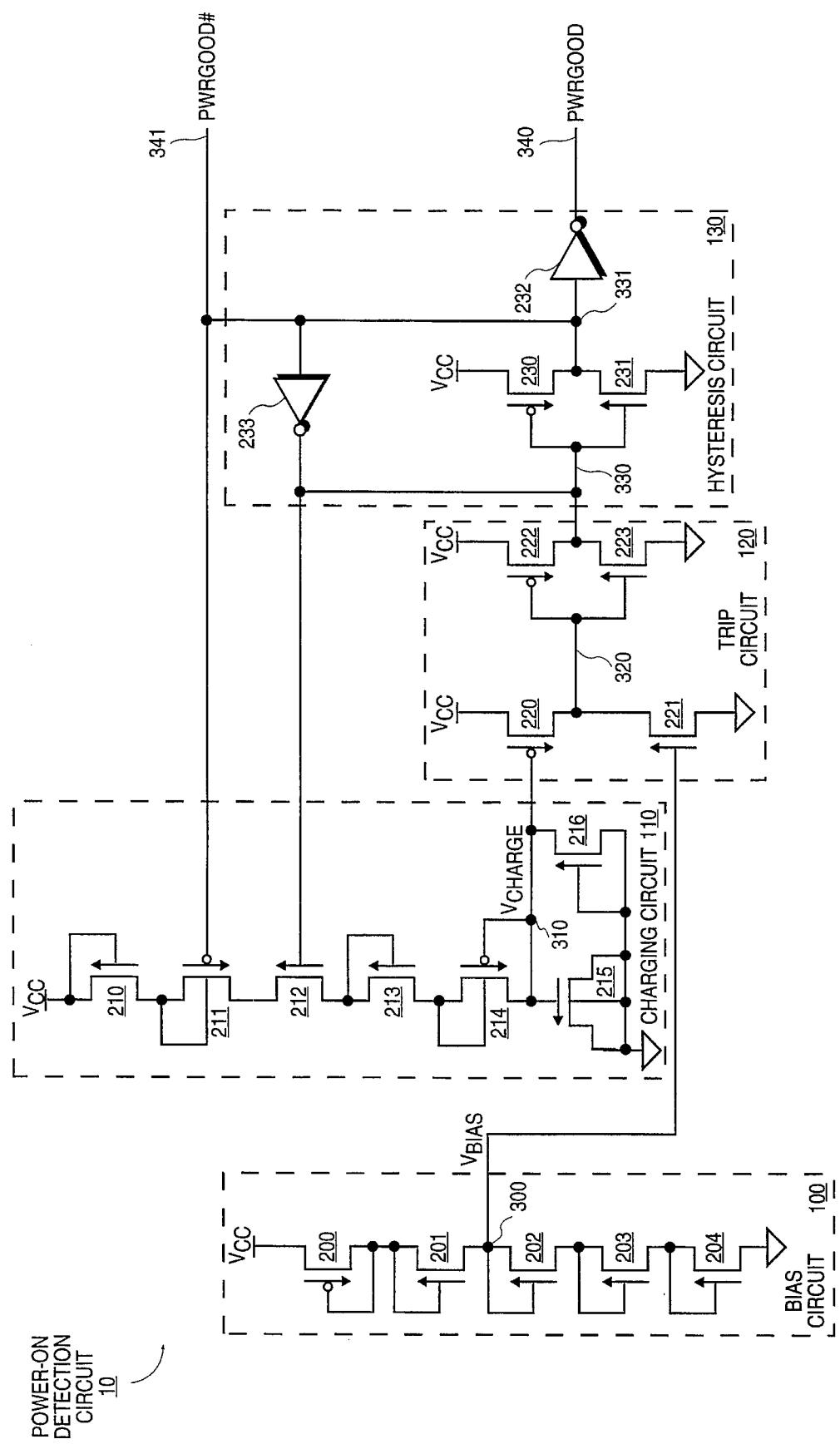
FIG. 1 shows a power-on detection circuit according to one embodiment.

FIG. 1 shows one embodiment of a power-on detection circuit for use in an integrated circuit. Initially, when the power supply is switched on, power-on detection circuit 10 operates in an "untripped" state. Once the supply output voltage achieves a predetermined threshold voltage, power-on detection circuit 10 enters a "tripped" state and asserts the PWRGOOD and PWRGOOD# signals to indicate that the supply output voltage is available for use by the remaining circuitry of the integrated circuit.

Power-on detection circuit 10 is shown as generally comprising a bias circuit 100, a charging circuit 110, a trip circuit 120, and an hysteresis circuit 130. Trip circuit 120 is coupled to receive a bias voltage $V_{BIAS}$ from bias circuit 100 and a charging voltage $V_{CHARGE}$ from the charging circuit 110. While the power-on detection circuit 10 is operating in the untripped state, charging circuit 110 is switched off such that $V_{CHARGE}$ is approximately equal to system ground VSS, and bias circuit 100 outputs $V_{BIAS}$ as a function of the supply output voltage VCC. According to the present embodiment, the bias voltage $V_{BIAS}$ is a constant ratio of the supply output voltage VCC such that $V_{BIAS}$ rises and falls with VCC at the same rate as the supply output voltage VCC. The PWRGOOD and PWRGOOD# signals are deasserted (logic low and logic high, respectively) when power-on detection circuit 10 operates in the untripped state.

While power-on detection circuit 10 is operating in the untripped state, trip circuit 120 provides an output signal having a first state. According to the present embodiment, trip circuit 120 outputs a logic low when power-on detection circuit 10 is in the untripped state. When the supply output voltage VCC rises to a predetermined voltage, power-on detection circuit 10 enters the tripped state of operation, and the output signal of trip circuit 120 changes from the first state to a second state. Hysteresis circuit 130 provides hysteresis to speed the transition between states and to help to prevent the power-on detection circuit 10 from exiting the tripped state in response to noise on the supply output voltage VCC. According to the present embodiment, trip circuit 120 outputs the supply output voltage VCC when power-on detection circuit 10 is operating in the tripped state. Hysteresis circuit 130 asserts PWRGOOD (logic high) and PWRGOOD# (logic low) in response to the output of trip circuit 120 switching states. When the PWRGOOD# signal is asserted (logic low), charging circuit 110 is switched on, and the charging voltage $V_{CHARGE}$ is charged up to the supply output voltage VCC as an RC function of VCC.

Power-on detection circuit is also operative to detect when the supply output voltage VCC drops below the predetermined voltage. For example, should the power supply be switched off such that the supply output voltage VCC drops to zero volts, charging circuit 110 is configured to switch off such that power-on detection circuit may again enter the untripped state.

Bias circuit 100 is shown as a voltage divider circuit that supplies the bias voltage $V_{BIAS}$ as a constant ratio of VCC, but alternative bias circuit topologies may be used. According to the present embodiment, bias circuit 100 comprises p-channel transistor 200 and n-channel transistors 201–204 coupled in series between VCC and system ground VSS. As shown, the bias voltage $V_{BIAS}$ is supplied from a node 300 that is defined between the source of transistor 201 and the drain of transistor 202. According to the present embodiment, transistors 200–204 are sized such that the bias voltage is approximately equal to 0.6 VCC. Bias circuit 100 may be varied as needed to provide different bias voltages.

Charging circuit 110 is shown as an RC network coupled between the supply output voltage VCC and system ground VSS and comprising p-channel transistor 211 and n-channel transistors 210 and 212–216 wherein transistors 210–214 are coupled to operate as resistors, transistor 215 is coupled to operate as a capacitor, and transistor 216 is coupled to operate as diode. The gates of transistors 211 and 212 are coupled to hysteresis circuit 130 and are switched off while power-on detection circuit 10 is operating in the untripped state. Therefore, no active current flows through charging circuit 110 when power-on detection circuit 110 is operating in the untripped state, and the charging voltage $V_{CHARGE}$ that is taken from a node 310 defined between the drain of transistor 214 and the gate of transistor 215 is approximately equal to system ground VSS. When hysteresis circuit 130 switches transistors 211 and 212 on, $V_{CHARGE}$ is charged to the supply output voltage VCC as an RC function of VCC.

Both bias circuit 100 and charging circuit 110 include at least one n-channel transistor and one p-channel transistor coupled as resistive devices. The inclusion of both n-channel and p-channel devices allows power-on detection circuit 10 to compensate for process variations.

Diode-connected transistor 216 provides a discharge path for capacitor-connected transistor 215 should transistors 211 and 212 be switched off when power-on detection circuit 10 is otherwise operating in the tripped state. This may occur, for example, when the power supply is switched off such that supply output voltage VCC ramps down. When capacitor-connected transistor 215 is discharged, $V_{CHARGE}$ drops such that pull-up transistor 220 will be switched on and power-on detection circuit 10 will be returned to the untripped state if the supply output voltage VCC is more positive than $V_{CHARGE}$ by the threshold voltage of pull-up transistor 220. Diode-connected transistor 216 also prevents the charging voltage $V_{CHARGE}$ from dropping more than a diode drop below system ground VSS.

Trip circuit 120 generally comprises a pull-up transistor 220, a pull-down transistor 221, and a CMOS inverter comprising transistors 222 and 223. Pull-up transistor 220 has its gate coupled to receive the charging voltage $V_{CHARGE}$, its source coupled to the supply output voltage VCC, and its drain coupled to a common node 320. Pull-down transistor 221 has its gate coupled to receive the bias voltage $V_{BIAS}$, its source coupled to system ground VSS, and its drain coupled to common node 320. Common node 320 provides the input voltage to the CMOS inverter, and the trip voltage of trip circuit 120 is determined by the trip voltage of the CMOS inverter.

As stated previously, when power-on detection circuit 10 is operating in the untripped state, transistors 211 and 212 of charging circuit 110 are switched off and the charging voltage $V_{CHARGE}$ is approximately equal to system ground VSS. Because the source of pull-up transistor 220 is coupled to the supply output voltage VCC and the gate voltage is fixed at approximately at system ground VSS, transistor 220 switches on when VCC is approximately equal to the threshold voltage $V_{tp}$ of transistor 220. Once transistor 220 is switched on, common node 320 is coupled to VCC and rise with VCC until transistor 221 switches on, whereupon the voltage at common node 320 is pulled down below the supply output voltage VCC.

Transistor 221 switches on when $V_{BIAS}$ exceeds the threshold voltage $V_{tn}$ of transistor 221. As the supply output voltage VCC continues to increase, $V_{BIAS}$ increases until pull-down transistor 221 operates in the saturated region, whereupon the voltage at common node 320 drops below the trip voltage of the CMOS inverter. When node 320 drops below the trip voltage, the output of the CMOS inverter changes states to couple output node 330 to the supply output voltage VCC, indicating that the supply output voltage VCC has reached the predetermined voltage and the integrated circuit may begin normal operation. Power-on detection circuit 10 enters the tripped state when the voltage at common node 320 drops below the trip voltage.

The sizing of the transistors of trip circuit 120 are important to ensure proper operation of power-on detection circuit 10. According to the present embodiment, transistor 220 has a channel width of 2.5 µm and a channel length of 1.0 µm, transistor 221 has a channel width of 5.5 µm and a channel length of 1.0 µm, transistor 222 has a channel width of 6.0 µm and a channel length of 1.0 µm, and transistor 223 has a channel width of 2.8 µm and a channel length of 1.0 µm. The sizing of transistors 220 and 221 is such that transistor 221 can sink more current than transistor 220 can source when transistor 220 is switched on. The sizing of transistors 222 and 223 is such that transitions in the output of the inverter formed by transistors 222 and 223 can overcome the hysteresis of the hysteresis circuit 130. The sizes of the transistors may be adjusted as required, and other device sizes may be used.

Hysteresis circuit 130 is coupled to the output of trip circuit 120 and is shown as comprising three inverters. The first inverter, formed by transistors 230 and 231, has an input coupled to node 330 and an output coupled node 331, which provides the PWRGOOD# signal. Inverter 232 inverts the PWRGOOD# signal to provide the PWRGOOD signal. Inverter 233 is coupled in a positive feedback arrangement between nodes 231 and 230 in order to provide hysteresis that sharpens the transitions at output node 330 when the CMOS inverter of trip circuit 120 switches states. The output of inverter 233 is also provided as the input to transistor 212 for switching on charging circuit 110 when power-on detection circuit 10 enters the tripped state. Transistor 211 of charging circuit 110 is switched on in response to the voltage at node 331.

When charging circuit 110 is switched on, capacitor-connected transistor 215 begins to charge towards the supply output voltage VCC. Thus, the charging voltage $V_{CHARGE}$ increases as an RC function of the supply output voltage VCC, wherein the RC time constant is determined by the resistance values of transistors 210–214 and the capacitance of transistor 215. Eventually, transistor 220 switches off, removing the current path between VCC and VSS. The RC network of charging circuit 110 also provides a filtering effect to filter power supply transients.

Power-on detection circuit 10 is also operative to detect when the supply output voltage VCC drops below the predetermined voltage, which may occur, for example, when the power supply is switched off and the supply output voltage VCC ramps down. Diode-connected transistor 216 acts as a voltage limiter for preventing the charging voltage $V_{CHARGE}$ at node 310 from becoming too negative. Capacitor-connected transistor 215 discharges through diode-connected transistor 216.

Figure 2:
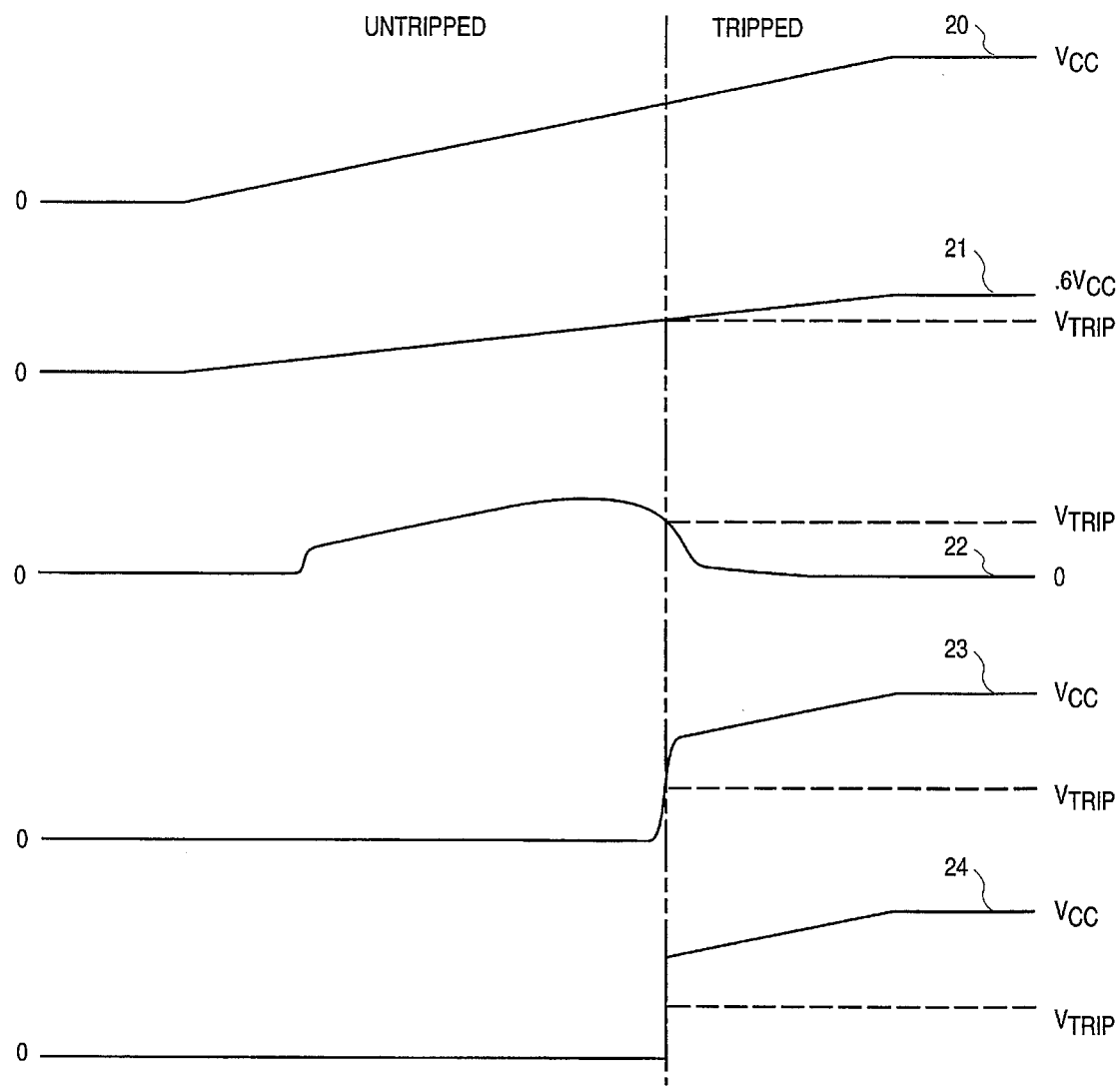
FIG. 2 shows voltage waveforms associated with nodes in the power-on detection circuit during power supply ramp up.

FIG. 2 shows voltage waveforms associated with nodes in the power-on detection circuit during power supply ramp up. Waveform 20 shows the supply output voltage VCC as it is rises from system ground VSS to a full operating level as a function of time. Waveform 21 shows the bias voltage $V_{BIAS}$ as a function of time. Waveform 22 shows the voltage at common node 320 as a function of time. Waveform 23 shows the voltage at node 330. Waveform 24 indicates the voltage at output 340, which is the PWRGOOD signal.

In the foregoing specification the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than restrictive sense.

What is claimed is:

1. A power-on detection circuit for detecting when a supply output voltage exceeds a predetermined level comprising:
   a pull-up transistor and a pull-down transistor commonly coupled to a node for biasing the node to a first voltage;
   a bias circuit operative to output a bias voltage that rises with the supply output voltage for biasing the pull-down transistor;
   a charging circuit operative to output a charging voltage for biasing the pull-up transistor;
   an inverter coupled to the node for receiving the first voltage, the inverter indicating that the supply output voltage is less than the predetermined level when the first voltage is greater than a trip voltage of the inverter, the inverter indicating that the supply output voltage exceeds the predetermined level when the first voltage is less than the trip voltage of the inverter; and
   a hysteresis circuit coupled to an output of the inverter and to the charge circuit, the hysteresis circuit providing positive feedback between the output and an input of the inverter, the hysteresis circuit for switching off the charging circuit when the inverter indicates that the supply output voltage is less than the predetermined level and for switching on the charging circuit when the inverter indicates that the supply output voltage exceeds the predetermined level.

2. The power-on detection circuit of claim 1 wherein the bias circuit comprises a voltage divider.

3. The power-on detection circuit of claim 2 wherein the charging circuit comprises an RC filter network.

4. A power-on detection circuit for detecting when a supply output voltage exceeds a predetermined level, the power-on detection circuit operating in an untripped state when the supply output voltage is less than a predetermined voltage level and operating in a tripped state when the supply output voltage exceeds the predetermined voltage level, the power-on detection circuit comprising:
   a bias circuit that outputs a bias voltage that ramps as the supply output voltage ramps;
   a charging circuit that outputs a charging voltage;
   a trip circuit coupled to receive the bias voltage and the charging voltage, the trip circuit comprising:
      a pull-up transistor having a gate coupled to receive the charging voltage, a source coupled to the supply output voltage, and a drain coupled to a common node;
      a pull-down transistor having a gate coupled to receive the bias voltage, a drain coupled to the common node, and a source coupled to system ground;
   an inverter with an input coupled to the common node, the inverter outputting approximately the supply output voltage when a voltage at the common node is below a trip voltage of the inverter and outputting approximately system ground when the voltage of the common node is above the trip voltage; and
   a hysteresis circuit coupled to the inverter, the hysteresis circuit disabling the charging circuit when the inverter outputs approximately system ground such that the pull-up transistor is switched on and the power-on detection circuit operates in the untripped state, the hysteresis circuit enabling the charging circuit when the inverter outputs approximately the supply output voltage such that the pull-up transistor is switched off and the power-on detection circuit operates in the tripped state.

5. The circuit of claim 4 wherein the bias circuit is a voltage divider such that the bias voltage is a fixed proportion of the supply voltage.

6. The circuit of claim 5 wherein the charging circuit coupled to the gate of the pull-up transistor is an RC filter network that provides system ground to the gate of the pull-up transistor when the power-on detection circuit is operating in the untripped state and provides voltage that is an RC function of the supply voltage when the power-on detection circuit is operating in the tripped state.

* * * * *